United States Patent [19]

Miyashita

[11] Patent Number: 5,302,911
[45] Date of Patent: Apr. 12, 1994

[54] PREAMPLIFIER

[75] Inventor: Miyo Miyashita, Itami, Japan

[73] Assignee: Mitsubishi Denki Kabushiki Kaisha, Tokyo, Japan

[21] Appl. No.: 995,690

[22] Filed: Dec. 23, 1992

[30] Foreign Application Priority Data

Jul. 10, 1992 [JP] Japan .................................. 4-207317

[51] Int. Cl.$^5$ ................................................ H03F 3/08
[52] U.S. Cl. ...................................... 330/110; 330/308
[58] Field of Search .................... 250/214 A, 214 LA; 330/59, 110, 308

[56] References Cited

U.S. PATENT DOCUMENTS 4,218,613  8/1980  Bletz .............................. 330/110 X
4,679,251  7/1987  Chown ........................... 330/110 X

FOREIGN PATENT DOCUMENTS 63-136804  6/1988  Japan .
2-70109    3/1990  Japan .
3-54905    3/1991  Japan .

OTHER PUBLICATIONS

Muoi, "Receiver Design for High-Speed Optical-Fiber Systems", Journal of Lightwave Technology, vol. LT-2, No. 3, Jun. 1984, pp. 243-267.
Minasian, "Optimum Design of a 4-Gbit/s GaAs MESFET Optical Preamplifier", Journal of Lightwave Technology, vol. LT-5, No. 3, Mar. 1987, pp. 373-379.

Primary Examiner—Steven Mottola
Attorney, Agent, or Firm—Leydig, Voit & Mayer

[57] ABSTRACT

A preamplifier converting an input current signal into an output voltage signal and outputting the voltage signal includes a voltage amplifier, a feedback resistor connected in parallel with the voltage amplifier, and a plurality of diodes connected in series to each other and in parallel with the feedback resistor. In this circuit, the voltage drop of the feedback resistor for turning on the diodes increases in proportion to the number of diodes, thereby changing the input signal level at which the feedback resistance switches. A fuse may be connected in parallel with each of the diodes, a bonding pad may be connected to each of them, or an FET may be connected in parallel with each them to enable short-circuiting of each of the diodes. Thereby, an increased dynamic input range is obtained while giving consideration to the sensitivity and the amplification factor of the amplifier.

10 Claims, 14 Drawing Sheets

PREAMPLIFIER

FIELD OF THE INVENTION

The present invention relates to a preamplifier and, more particularly, to a preamplifier in an optical receiver employed for an optical linking system.

BACKGROUND OF THE INVENTIONS

FIG. 11 is a block diagram showing an optical receiver employing a prior art transimpedance type preamplifier. In the FIG., a receiver 10 comprises a transimpedance type preamplifier 1 and a photodiode 5. A p-side electrode of the photodiode 5 is connected to an input of the transimpedance type preamplifier 1. The transimpedance type preamplifier 1 comprises a voltage amplifier 2 and a feedback resistor 3 which is attached to the voltage amplifier 2. That is, the feedback resistor 3 is connected in parallel between an input and output of the voltage amplifier 2 so as to feedback a part of the output signal of the voltage amplifier 2 to the input side. Reference numeral 4 designates an input terminal and numeral 6 designates an output terminal. Reference character $P_{out}$ shows light, reference character $I_{in}$ shows a current signal from the photodiode 5 and reference character $V_{out}$ shows a voltage signal output from the preamplifier 1.

A description is given of the operations.

Light $P_{out}$ entering the photodiode 5 is converted into a current signal $I_{in}$ through the photodiode 5 and enters into the preamplifier 1 from the input terminal 4. The current signal $I_{in}$ flows into the feedback resistor 3 if the input impedance of the voltage amplifier 2 is sufficiently high. In this case, when a gain of the voltage amplifier 2 is sufficiently high, suppose that the resistance value of the feedback resistor 3 is $Rf[\Omega]$ and the current signal amplitude is $\Delta I_{in}$, then the output voltage amplitude $\Delta V_{out}$ is represented as follows:

$$\Delta V_{out} = \Delta I_{in} \cdot Rf \cdot \quad (1)$$

In addition, the noise of the optical receiver 10 comprising the photodiode 5 and the preamplifier 1 is represented by the noise converted into input noise current density (unit:[A/$\sqrt{Hz}$]). This noise is controlled by a thermal noise due to the feedback resistor 3 and the channel noise of a source grounded field effect transistor (hereinafter referred to as an FET) in the voltage amplifier 2. The thermal noise $<i_{Rf}2>$ (unit:[A/$\sqrt{Hz}$]) due to the feedback resistor 3 is represented as follows:

$$<i_{Rf}2> = \frac{4KT}{Rf} \Delta f, \quad (2)$$

where T is absolute temperature, K is Boltzmann's constant, and $\Delta$ f is the operational bandwidth.

On the other hand, the 3dB bandwidth of the optical receiver 10 ($f_{3dB}$) is, supposing that the capacitance of the photodiode 5 is $C_{pd}$, the input capacitance of the preamplifier 1 is $C_{in}$ and the voltage gain of the voltage amplifier 2 is A, represented as follows:

$$f_{3dB} = \frac{A}{2\pi(C_{pd} + C_{in})Rf} \cdot \quad (3)$$

According to these formulae, in order to improve the sensitivity of the optical receiver 10 comprising the photodiode 5 and the preamplifier 1, it is effective to increase the feedback resistance value Rf of the feedback resistor 3 in the preamplifier 1 while maintaining the necessary bandwidth.

FIG. 12 shows the characteristic of the output voltage amplitude against the input current amplitude of the preamplifier 1. In the FIG., a curve obtained by connecting black dot • points shows the output voltage amplitude versus the input current amplitude when the feedback resistance value Rf is 2.2k$\Omega$ at a transmission speed of 622 Mb/s and a curve obtained by connecting crossed marks ×shows the output voltage amplitude against the input current amplitude when the feedback resistance value Rf is 200$\Omega$ at a transmission speed of 622 Mb/s. FIGS. 13 to 16 are diagrams showing output voltage waveform versus input current amplitude when the feedback resistance value Rf is 2.2k$\Omega$ and the input current amplitude is 0.2 mAp-p, 0.5 mAp-p, 1 mAp-p or 2 mAp-p, respectively. From these FIGS., it is apparent that, although it is, as described above, effective to increase the feedback resistance value Rf of the feedback resistor 3 in the preamplifier 1 to increase the sensitivity of the preamplifier 1, the dynamic input range is reduced due to an increase in the input impedance and the duty ratio of the output voltage signal unfavorably changes. More particularly, the output voltage signal is unfavorably distorted when a large signal, namely an input current having a large amplitude, is input as particularly shown in FIGS. 15 and 16.

Disclosed in Japanese Published Patent Application No. 3-54905 is a preamplifier in which the substantive feedback resistance value is changed between a value for inputting a large signal and a valve for inputting a small signal so as to enlarge the input dynamic range, thereby obtaining an output voltage signal without distortion when a large signal is input. FIG. 17 is a block diagram showing an optical receiver in which a diode is connected in parallel with a feedback resistor constituting the preamplifier similar to the optical receiver disclosed in Japanese Published Patent Application No. 3-54905. In the FIG., the same reference numerals as those of FIG. 11 designate the same or corresponding parts. A receiver 20 comprises a preamplifier 1a and the photodiode 5. In the preamplifier 1a, a diode 7 is connected in parallel with the feedback resistor 3 so that an anode of the diode 7 is connected to an input terminal 4 and a cathode thereof to an output terminal 6.

Next, a description is given of the operation.

Almost all of the current signal $I_{in}$ from the photodiode 5 flows into the feedback resistor 3 similarly as the optical receiver 10 shown in FIG. 11, and when the voltage drop of the feedback resistor 3 is less than the thresh-old voltage of a forward direction current flow of the diode 7 connected in parallel, a current almost flows into the feedback resistor 3 and the operation is the same as in the case with no diode 7. When the voltage drop of the feedback resistor 3 exceeds the threshold voltage of the forward direction current, a current also begins to flow through the diode 7 suppose that a resistance value when the diode 7 is "on" state is Rdf, the actual feedback resistance value is represented as follows:

$$Rfs = \frac{Rf \cdot Rdf}{Rf + Rdf} \cdot \quad (4)$$

Particularly, when Rf>>Rdf, the feedback resistance value Rfs is reduced to a value represented by the following formula (5) and the dynamic range is enlarged by that degree.

$$R_{fs} = R_{df} \quad (5)$$

FIG. 18 shows a characteristic of the output voltage amplitude versus the input current amplitude of the preamplifier 1a when the feedback resistance value Rf of the feedback resistor 3 is 2.2kΩ and an internal resistance Rdf of the diode 7 in the "on" state is fixed at 180Ω at a transmission speed of 622 Mb/s. The threshold voltage of the forward direction current (Schottky barrier voltage) of the diode 7 is dependent on a material of the diode 7. Here, a Schottky diode formed on a GaAs substrate is employed and the threshold up voltage of the forward direction current (Schottky barrier voltage) is approximately 0.6 V.

As is apparent from the FIG., when the input current amplitude to the preamplifier 1a is within 0.0 to 0.3 mAp-p, since the voltage drop in the feedback resistor 3 is equal to or less than 0.6 V., little current flows through the diode and the gain at transformation between an input current and an output voltage, namely, a transimpedance gain is almost determined by the feedback resistance value (2.2 kΩ) of the feedback resistor 3 and the noise characteristic is almost the same as that of a case without the diode 7. However, when the input current amplitude is over 0.3 mAp-p, the voltage drop in the feedback resistor 3 is larger than 0.6 V and the diode 7 is "on" state. At this time, the feedback resistance value Rf of the feedback resistor 3 is significantly larger than the internal resistance value Rdf of the diode and the transimpedance gain becomes almost equal to the internal resistance value Rdf of the diode (180 Ω) and the input dynamic range is enlarged to 5 mAp-p compared to about 1 mAp-p without the diode 7 (refer to FIG. 12).

FIGS. 19(a) and 19(b) are diagrams showing an input current waveform and an output voltage waveform in the preamplifier 1a in the above-described operation. FIG. 19(a) shows an input current waveform and an output voltage waveform when the input current amplitude is 0.2 mAp-p and FIG. 19(b) shows an input current waveform and an output voltage waveform when the input current amplitude is 2.0 mAp-p. As shown in the FIGS., while in the preamplifier 1 shown in FIG. 11 the duty cycle of the output voltage waveform varies when the input current amplitude increases to 2 mAp-p, the duty cycle does not vary even when the input current amplitude increases to 2 mAp-p in this preamplifier 1a, resulting in an output signal with no distortion.

In the prior art preamplifier a described above, a diode is connected in parallel with the feedback resistor so as to prevent a reduction in the output voltage when a large signal, namely, an input current having a large amplitude, is input, thereby enlarging the input dynamic range.

In the construction where a single diode 7 is connected in parallel with the feedback resistor 3, however, because the threshold voltage of the forward direction current of the diode connected in parallel with the feedback resistor is dependent on the material of the diode as described above, while it is possible to enlarge the dynamic range, the input signal level by which the diode is turned on, that is, an input signal level where a substantive feedback resistance value is switched, is fixed. Therefore, even if it is desirable to obtain a voltage amplitude above a certain level as the sensitivity of the amplifier when a small signal is input (for example, when a signal in a range from 0.5 to 1.0 mAp-p is input), the desired voltage value cannot be obtained when the switching point of the substantive feedback resistance value is at a signal level smaller than this input signal.

In addition, since as a characteristic of a diode, little current flows through the diode when the voltage does not exceed the Schottky barrier voltage and a current suddenly flows when the forward direction voltage exceeds the Schottky barrier voltage, that is, when the diode is turned on, the substantive feedback resistance value also varies suddenly before and after the diode is turned on. As a result, there is a problem that the linearity of the amplification is poor and a device which is connected to the amplifier at a latter stage thereof may malfunction.

SUMMARY OF THE INVENTION

It is an object of the present invention to provide a preamplifier having superiority in practical use in that not only input dynamic range is enlarged, but also the input signal level at which a substantive feedback resistance value is switched can be adjusted to a desirable level during the production of the preamplifier and before the use thereof.

It is another object of the present invention to provide a preamplifier than can not only enlarge input dynamic range but also provide nearly linear amplification.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

In a preamplifier according to an aspect of the present invention, a plurality of diodes connected in series with each other are connected in parallel with a feedback resistor which is arranged in parallel with a voltage amplifier, so that an anode of each of the diodes is connected at an input terminal of the voltage amplifier and a cathode thereof is connected at an output terminal of the voltage amplifier. As a result, the voltage drop by the feedback resistor for turning on the diodes increases in proportion to the number of diodes relative to the case where a single diode is connected in parallel with the feedback resistor, resulting in changing the input signal level at which a substantive feedback resistance value is switched.

In a preamplifier according to another aspect of the present invention, a fuse is connected in parallel with each of the diodes. Or, a bonding pad is connected to each of the input and the output side of the diodes so as to enable wire bonding for short-circuiting each of the diodes. Further, an FET is connected in parallel with each of the diodes. As a result, since it is possible to selectively switch each of the plurality of diodes into an "on" state when an input signal passes through, the input signal level at which a substantive feedback resistance value is switched can be selected for a particular sensitivity and amplification factor of the amplifier, or the matching with an external apparatus, in practical use.

In a preamplifier according to still another aspect of the present invention, a feedback resistor, comprising at least two resistors, is connected in parallel with a voltage amplifier, and an enhancement type FET is connected in parallel with one of the resistors of the feedback resistor so that a drain and a gate of the FET are connected at an input side of the voltage amplifier and a source thereof is connected at an output side of the voltage amplifier. As a result, the amplification factor does not change rapidly before and after the substantive feedback resistance value is switched, and the amplification can be close to a linear.

DETAILED DESCRIPTION OF THE PREFERRED EMBODIMENT

Embodiments of the present invention will be described in detail with reference to the drawings.

Figure 1:
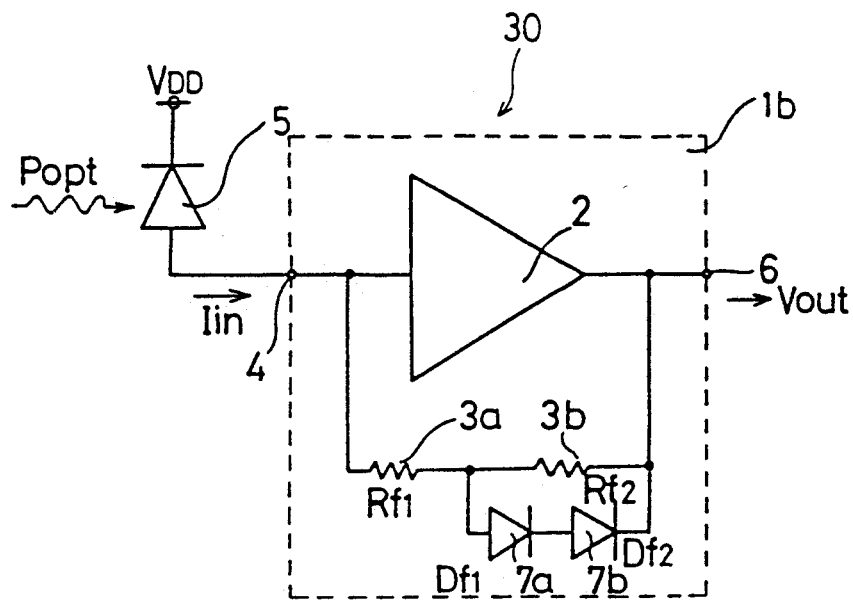
FIG. 1 is a block diagram showing a an optical receiver employing a preamplifier in accordance with a first embodiment of the present invention.
Figure 11:
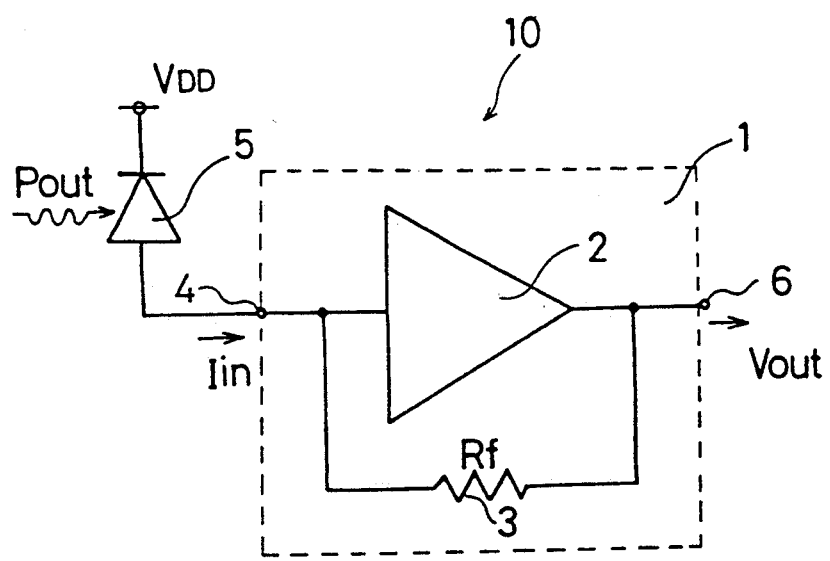
FIG. 11 is a block diagram showing an optical receiver employing a prior art preamplifier.
Figure 12:
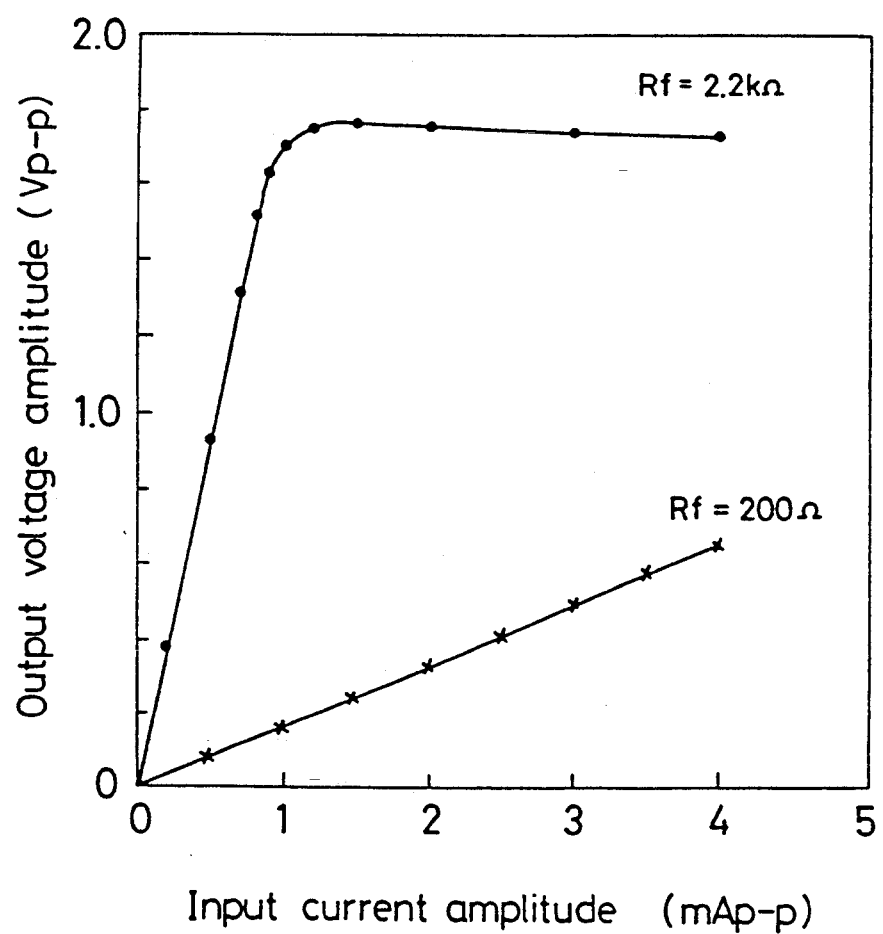
FIG. 12 is a diagram showing an input and an output characteristic o the preamplifier of FIG. 11.
Figure 13:
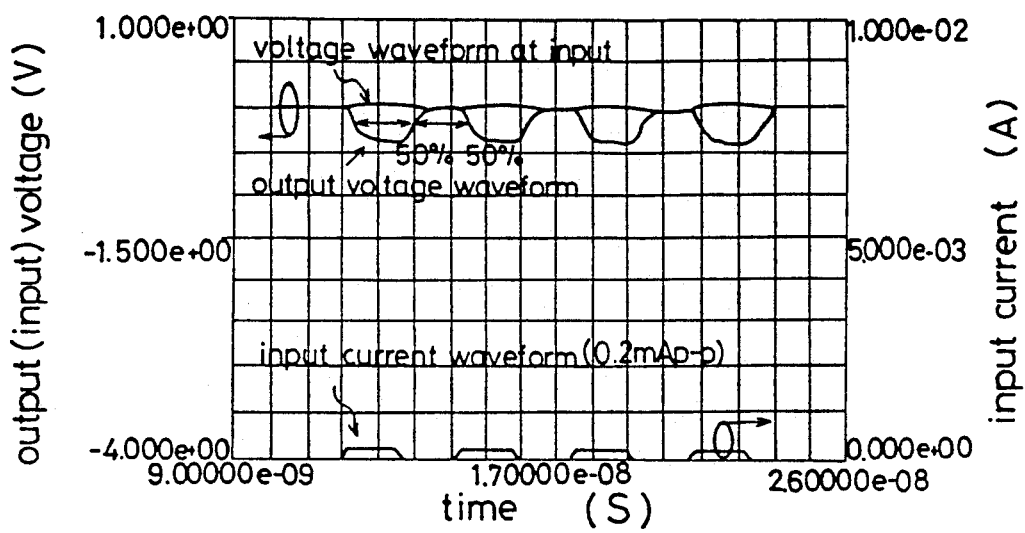
FIG. 13 is a diagram showing input and output waveforms of the preamplifier of FIG. 11.
Figure 14:
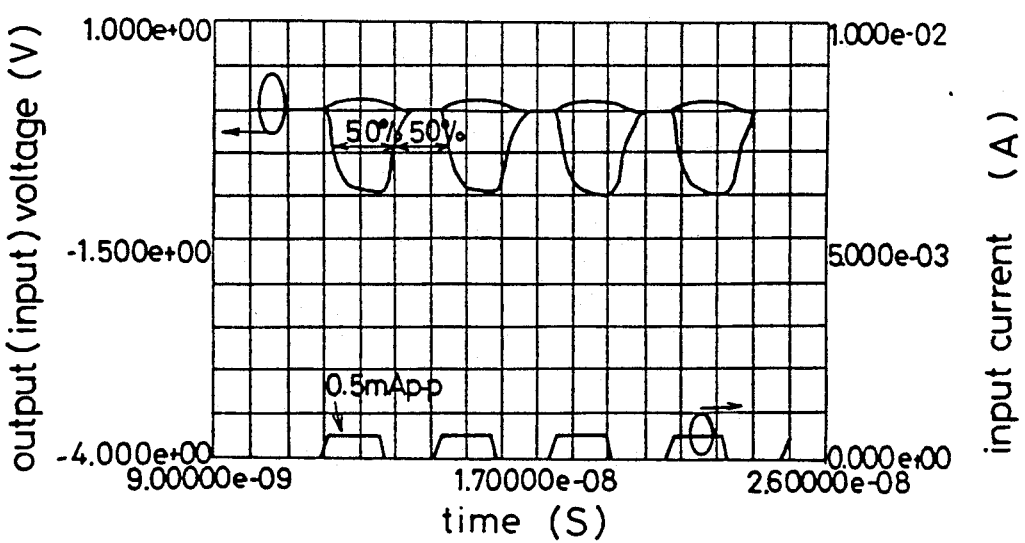
FIG. 14 is a diagram showing input and output waveforms of the preamplifier of FIG. 11.
Figure 15:
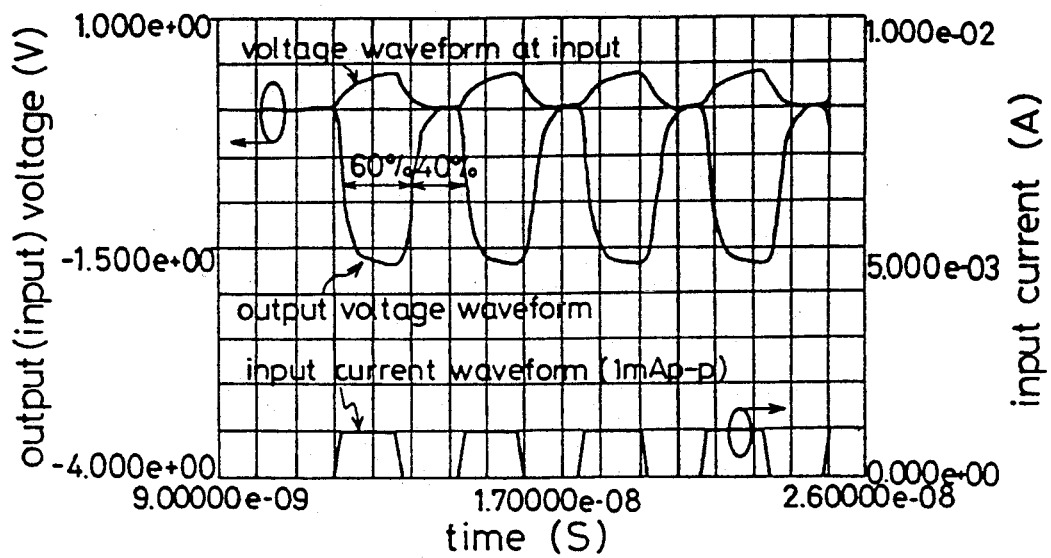
FIG. 15 is a diagram showing input and output waveforms of the preamplifier of FIG. 11.
Figure 16:
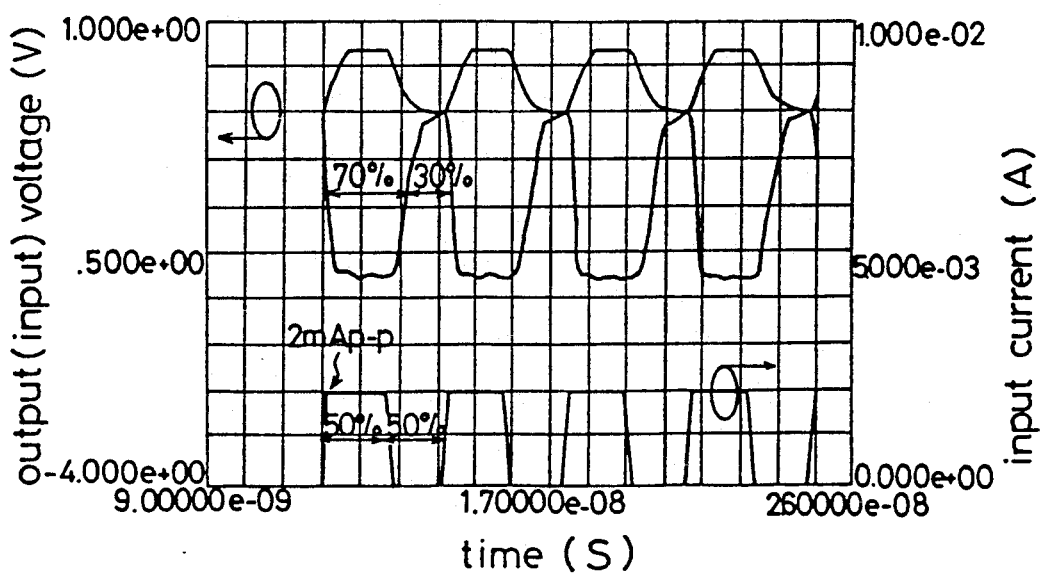
FIG. 16 is a diagram showing input and output waveforms of the preamplifier of FIG. 11.

FIG. 1 is a block diagram showing an optical receiver employing a preamplifier in accordance with a first embodiment of the present invention. In the figure, the same reference numerals as those of FIG. 11 designate the same or corresponding parts. An optical receiver 30 comprises a preamplifier 1b and the photodiode 5. The preamplifier 1b includes the voltage amplifier 2, feedback resistors 3a and 3b which are connected in parallel with the voltage amplifier 2 and in series to each other, and diodes 7a and 7b which are connected in series to each other and are connected in parallel with the feedback resistor 3b with an anode side of the two diodes at the side of the input terminal 4 and a cathode side thereof at the side of the output terminal 6. Here, diodes 7a and 7b are Schottky barrier diodes on a GaAs substrate and a threshold voltage of a forward direction current of each diode 7a, 7b (Schottky barrier voltage) of approximately 0.6V, similarly as the above-described diode 7.

Figure 2:
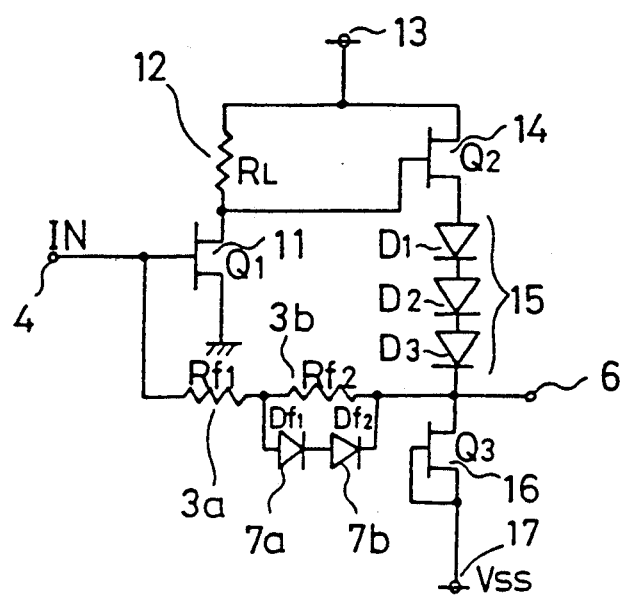
FIG. 2 is a block diagram showing a specific circuit of the preamplifier of FIG. 1.

FIG. 2 is a block diagram showing a circuit of the preamplifier 1b. The preamplifier 1b includes following: a source grounded FET 11(Ql) of which the gate is connected to the input terminal 4, a source follower FET 14(Q2) of which the gate is connected to a drain of the source grounded FET 11(Ql) and which achieves a level shift of the output voltage of the source grounded FET 11(Ql), a load resistance $R_L$ 12 connected between a power supply 13 to which the drain of the source follower FET 14(Q2) is connected and the drain of the source grounded FET 11(Ql), a constant current source FET 16(Q3) having its source and gate connected to the substrate potential 17(Vss), level shift diodes 15(D1 to D3) which are connected in series between the source of the source follower FET 14(Q2) and the constant current source FET 16(Q3) with the anode side of the diodes connected to the source of the source follower FET 14(Q2) and the cathode side connected to the drain of the constant current source FET 16(Q3), feedback resistors 3a and 3b which are connected in series between the connection node of the level shift diodes 15(DI to D3) with the drain of the constant current source FET 16(Q3) and the connection node of the gate of the source grounded FET 11(Ql) with the input terminal 4, functioning to return an output voltage of the level shift diodes 15(DI to D3) at the cathode of the diode D3 to the gate of the source grounded FET 11(Ql), and diodes 7a and 7b which are connected in series to each other and are connected in parallel with the feedback resistor 3b.

Next, a description is given of operations.

Figure 17:
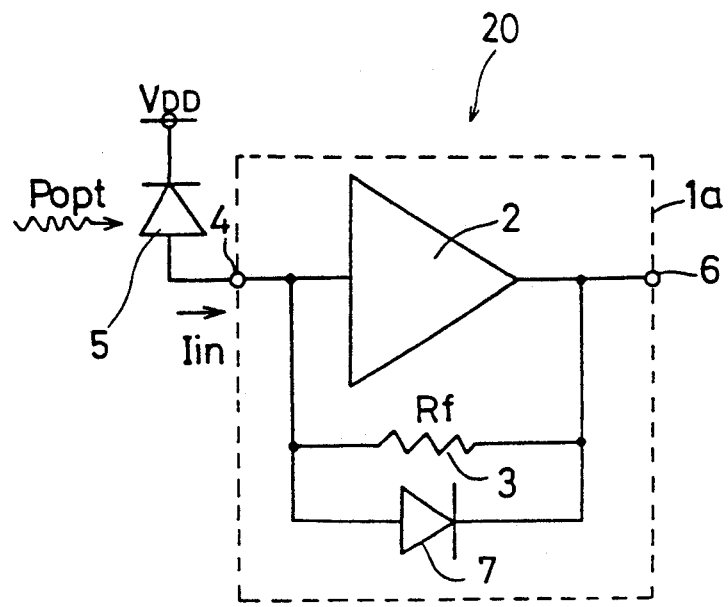
FIG. 17 is a block diagram showing an optical receiver employing a prior art preamplifier.
Figure 18:
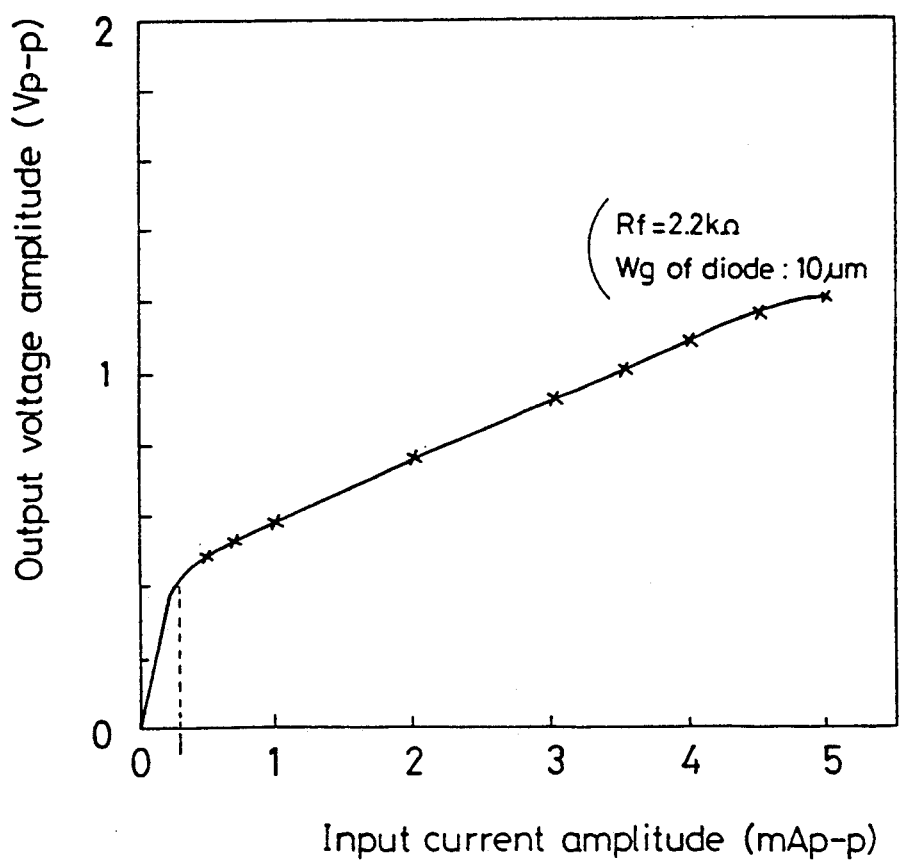
FIG. 18 is a diagram showing an input and an output characteristic of the preamplifier of FIG. 17.
Figure 19A:
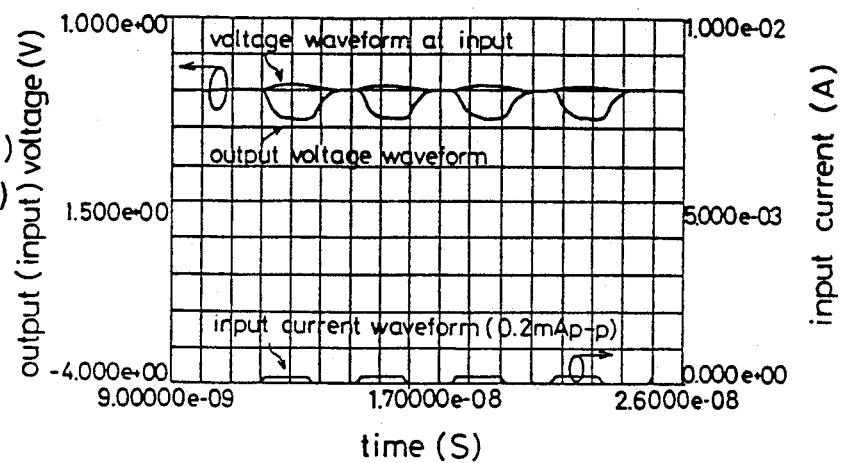
FIGS. 19(a) and 19(b) are diagrams showing input and output waveforms of the preamplifier of FIG. 17.
Figure 19B:
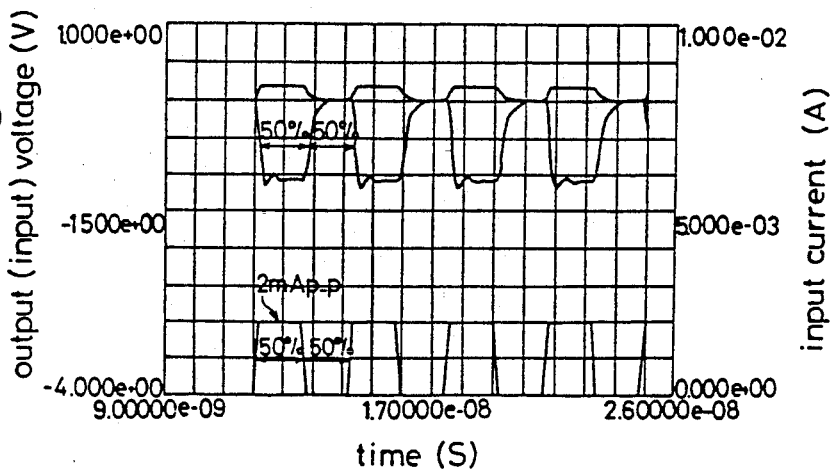

The fundamental operations are the same as those of the prior art optical receiver 20 shown in FIG. 17.

In this preamplifier 30, since the threshold voltage of a forward direction current (Schottky barrier voltage) of the diodes 7a and 7b is approximately 0.6V as described above and these diodes are connected in series to each other in order that a current flows through the diodes 7a and 7b, the voltage drop in the feedback resistor 3b must be above 1.2V (=0.6V×2). In this case, suppose that the resistance values of the feedback resistors 3a and 3b respectively are Rf1 and Rf2 and the resistance values of the diodes 7a and 7b in the "on" state are Rdf1 and Rdf2, a substantive feedback resistance value Rfs is represented as follows:

$$Rfs = Rf1 + \frac{Rf2\,Rdf1 + Rf2\,Rdf2}{Rf2 + Rdf1 + Rdf2}. \tag{6}$$

Particularly, when Rf2>>(Rdf1+Rdf2), since the feedback resistance value Rfs is reduced to a value represented by the following formula (7), the dynamic range can be enlarged by that degree.

$$Rfs = Rf1 + Rdf1 + Rdf2. \tag{7}$$

Figure 3:
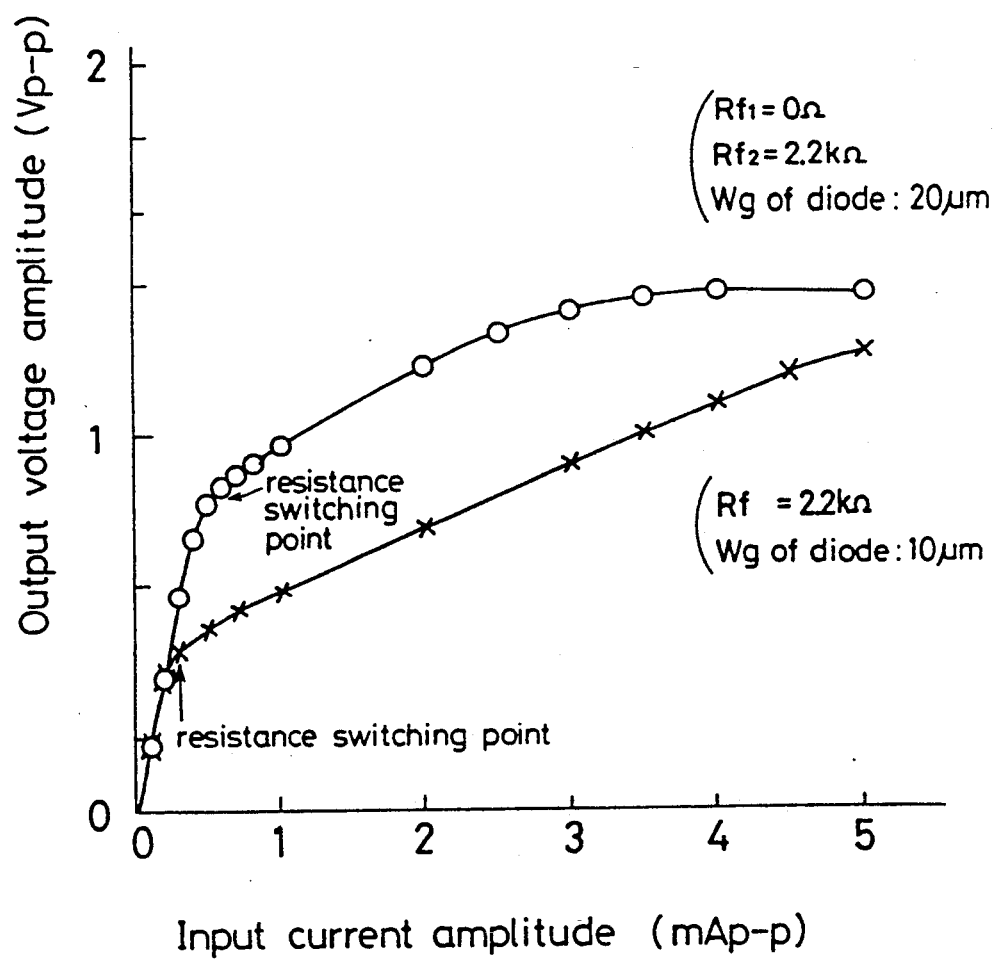
FIG. 3 is a diagram showing an input and an output characteristic of the preamplifier of FIG. 1 as compared with a prior art preamplifier.

FIG. 3 shows characteristics of an output voltage amplitude against an input current amplitude of the preamplifier 30 and the prior art preamplifier 20. In the figure, the curve obtained by connecting the white dots ○ points is a characteristic curve of this preamplifier 30 and the curve obtained by connecting the crossed marks X is a characteristic curve of the prior art preamplifier 20 shown in FIG. 17. Here, in the preamplifier 30, the size of the diodes 7a and 7b, namely a gate width Wg is made 20 microns which is twice as wide as that of the diode 7 of the prior art preamplifier 20 (gate width Wg=10 microns), and thus the resistance value of the diode part (diodes 7a and 7b) is equalized to the resistance value 360Ω of the diode part of the prior art preamplifier 20. Further, the resistance value of the feedback resistor 3a is made 0Ω and the resistance value of the feedback resistor 3b is made 2.2kΩ also as to equalize the whole resistance value to the feedback resistance value of the feedback resistor 3 of the prior art preamplifier 20. The amplifier is operated further in a transmission speed of 622 Mb/s.

Figure 4:
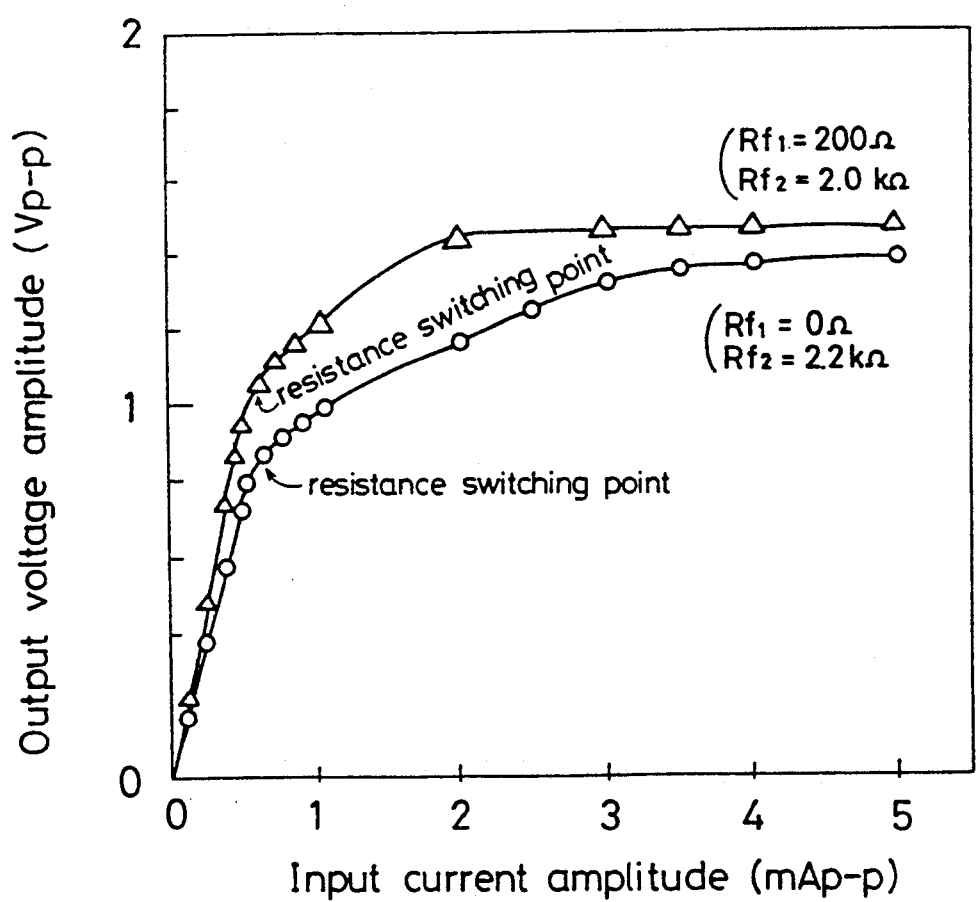
FIG. 4 is a diagram showing an input and an output characteristic of the preamplifier of FIG. 1.

As is apparent from this FIG., in this preamplifier 30, the input current amplitude (an input signal level) when the substantive feedback resistance value Rfs is switched from 2.2kΩ to 360Ω, is 0.6mAp-p which is twice as large as the value (0.03 mAp-p) of the prior art preamplifier 20 in which a single diode of 360Ω is connected in parallel with the feedback resistor 3. While two diodes 7a and 7b are connected in series to each other in parallel with the feedback resistor 3b, three or more diodes can be connected in series to each other in parallel with the feedback resistor 3b. In this case, the input signal level at which the substantive feedback resistance value is switched, increases, for example, to 0.9 mA, 1.2 mA, ..., in proportion to the number of diodes. While the value of the feedback resistor 3a is made 0Ω in obtaining the characteristic curve shown in FIG. 3 in order to effectuate a comparison with the prior art, by fixing the values of the feedback resistors 3a and 3b respectively, for example, at 200Ω and 2.0 kΩ to increase the substantive feedback resistance value Rfs in the "on" state of the diodes 7a and 7b, it is possible to change the ratio of the change of the output voltage amplitude against the change of the input current amplitude (namely, the amplification factor), before and after the substantive feedback resistance value Rfs is switched, as represented by a characteristic curve of the output voltage amplitude against the input current amplitude (Δ—Δ) shown in FIG. 4. The curve obtained by connecting the white dot ○ points in FIG. 4 is the same as a characteristic curve of FIG. 3. In the preamplifier of this embodiment, since a plurality of diodes are connected in parallel with the feedback resistor 3 and in series to each other, in a process of producing the preamplifier, by deciding properly the number of diodes which are connected, not only can input dynamic range be enlarged but also the input signal level at which the feedback resistance value is switched can be changed while giving consideration to the amplification characteristic of the amplifier. In addition, since not all of the feedback resistors connected in parallel with the voltage amplifier 2 but only a part of the resistors, namely the feedback resistor 3b of the two feedback resistors 3a and 3b, which are connected in series to each other, is connected to the diode, the input dynamic range can be enlarged while considering amplification factor, before and after the substantive feedback resistance value Rfs is switched.

Figure 5:
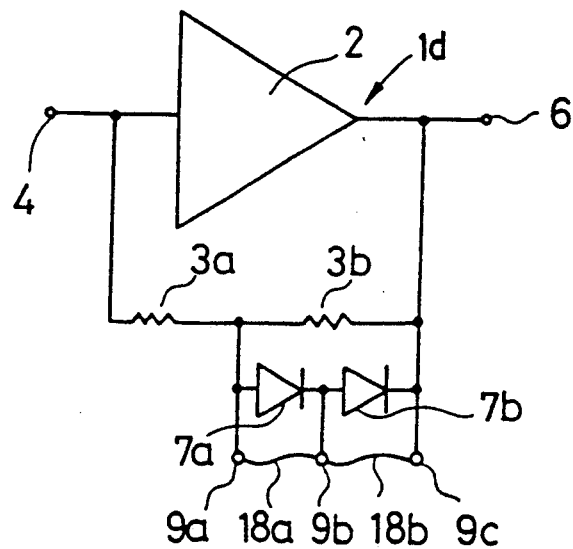
FIG. 5 is a block diagram showing a preamplifier in accordance with a second embodiment of the present invention.

FIG. 5 is a block diagram showing a preamplifier 1d in accordance with a second embodiment of the present invention. In the FIG., the same reference numerals as those of FIG. 1 designate the same or corresponding parts. In the preamplifier diffuses 18a and 18b are connected in parallel respectively with diodes 7a and 7b. Numerals 9a, 9b and 9c designate connection terminals.

In the preamplifier 1d of this embodiment, fuses 18a and 18b are connected in parallel respectively with diodes 7a and 7b which are connected in series to each other and in parallel with the feedback resistor 3b. Therefore, in an optical communication system, namely an optical linking system or the like constructed employing an optical receiver including the preamplifier 1d, by carrying out laser trimming of either or both of the fuses 18a and 18b in practical use, it is possible to selectively switch and forward an input signal to either or both of the diodes, thereby to adjust the switching point of the substantive feedback resistance value Rfs. In addition, by differentiating the internal resistance values Rdf1 and Rdf2 of the diodes 7a and 7b from each other, the amplification factor of the amplifier can be changed before and after the substantive feedback resistance value Rfs is switched.

While two diodes are employed in the above-described second embodiment, when three or more diodes are connected in series to each other and in parallel with the feedback resistor and fuses are connected in parallel with the respective diodes, there are provided an increased number of switching points of the substantive feedback resistance value Rfs, and thus an increased number of amplification factors before and after the switching points can be obtained relative to the above-described second embodiment.

Figure 6:
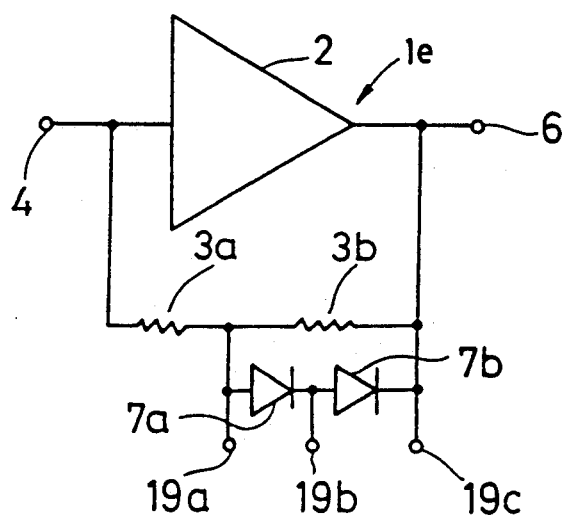
FIG. 6 is a block diagram showing a preamplifier in accordance with a third embodiment of the present invention.

FIG. 6 is a block diagram showing a preamplifier 1e in accordance with a third embodiment of the present invention. In the FIG., the same reference numerals as those of FIG. 1 designate the same or corresponding parts. In the preamplifier 1e, bonding pads 19a and 19b are connected respectively to input and output sides of a photodiode 7a and bonding pads 19b and 19c are connected respectively to input and output sides of a photodiode 7b.

In the preamplifier 1e of this embodiment, similarly as in the above-described second embodiment, in an optical communication system, namely an optical linking system or the like, employing an optical receiver including the preamplifier 1e, by wire bonding either between the bonding pads 19a and 19b or between the bonding pads 19b and 19c, an input signal can be forwarded to only a selected one of the diodes, thereby adjusting the switching point of the substantive feedback resistance value Rfs. In addition, similarly as in the second embodiment, by differentiating the internal resistance values Rdf1 and Rdf2 of the diodes 7a and 7b from each other, there are provided different amplification factors of the amplifier before and after the substantive feedback resistance value Rfs is switched.

While two diodes are employed in the above-described third embodiment, when three or more diodes are connected in series to each other and in parallel with the feedback resistor and the bonding pads are connected to the input and output sides of the respective diodes, there are provided an increased number of switching points of the substantive feedback resistance value Rfs and amplification factor before and after the switching points are changed relative to the above-described third embodiment.

Figure 7:
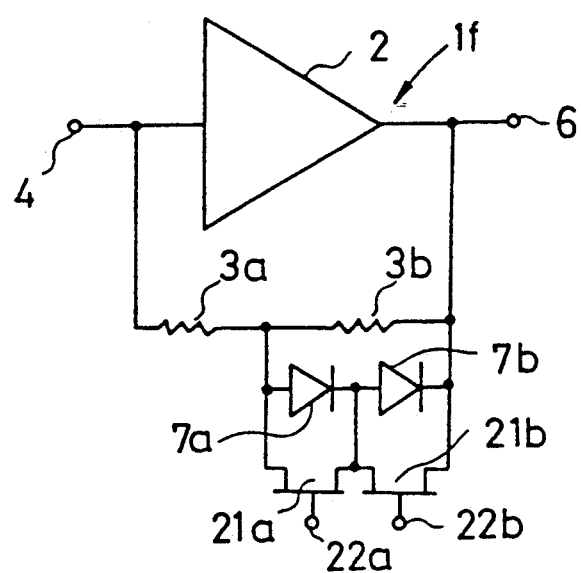
FIG. 7 is a block diagram showing a preamplifier in accordance with a fourth embodiment of the present invention.

FIG. 7 is a block diagram showing a preamplifier 1f accordance with a fourth embodiment of the present invention. In the FIG., the same reference numerals as those of FIG. 1 designate the same or corresponding parts. In the preamplifier 1f of this embodiment, FETs 21a and 21b as switching elements are connected in parallel respectively with the diodes 7a and 7b. Numerals 22a and 22b designate gate bias terminals.

In the preamplifier 1f of this embodiment in an optical communication system, namely an optical linking system or the like, employing an optical receiver including the preamplifier 1f, by controlling the "on" and states of FETs 21a and 21b with an external signal applied to the gate bias terminals 22a and 22b, it is possible to selectively switch an input signal to either or both of the diodes, thereby adjusting the switching point of the substantive feedback resistance value Rfs in accordance with the operation of the system. In addition, similarly as in the second embodiment, by differentiating the internal resistance values Rdf1 and Rdf2 of the diodes 7a and 7b from each other, an increased number of amplification factors of the amplifier is provided before and after the substantive feedback resistance value Rfs is switched.

While two diodes are employed in the above-described fourth embodiment, when three or more diodes are connected in series to each other and in parallel with the feedback resistor and the FETs are connected in parallel with the respective diodes, there are provided an increased number of switching points of the substantive feedback resistance value Rfs and amplification factors before and after the switching points are changed relative to the above-described fourth embodiment.

Figure 8:
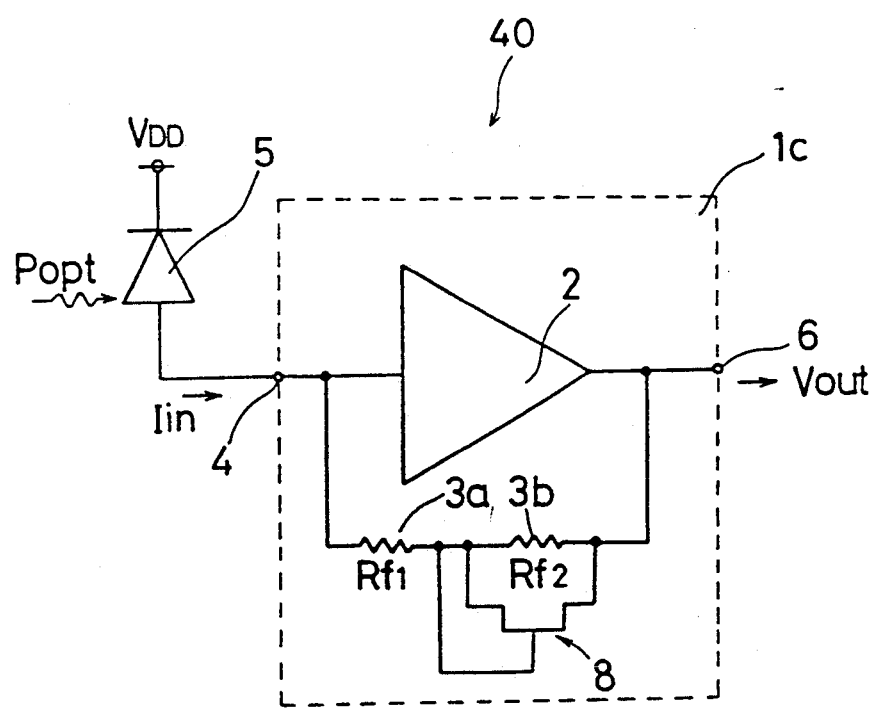
FIG. 8 is a block diagram showing an optical receiver employing a preamplifier in accordance with a fifth embodiment of the present invention.

FIG. 8 is a block diagram showing an optical receiver employing a preamplifier 1c in accordance with a fifth embodiment of the present invention. In the FIG., the same reference numerals as those of FIG. 1 designate the same or corresponding parts. An optical receiver 40 comprises the preamplifier 1c and the photodiode 5. The preamplifier 1c includes the voltage amplifier 2, feedback resistors 3a and 3b which are connected in parallel with the voltage amplifier 2 and connected in series to each other and an enhancement type FET 8 (hereinafter also referred to as EFET) which is connected in parallel with the feedback resistor 3b such that short-circuited drain and gate of the FET 8 are connected to an input side of the voltage amplifier 2 and a source thereof is connected to an output side of the voltage amplifier 2.

Figure 9:
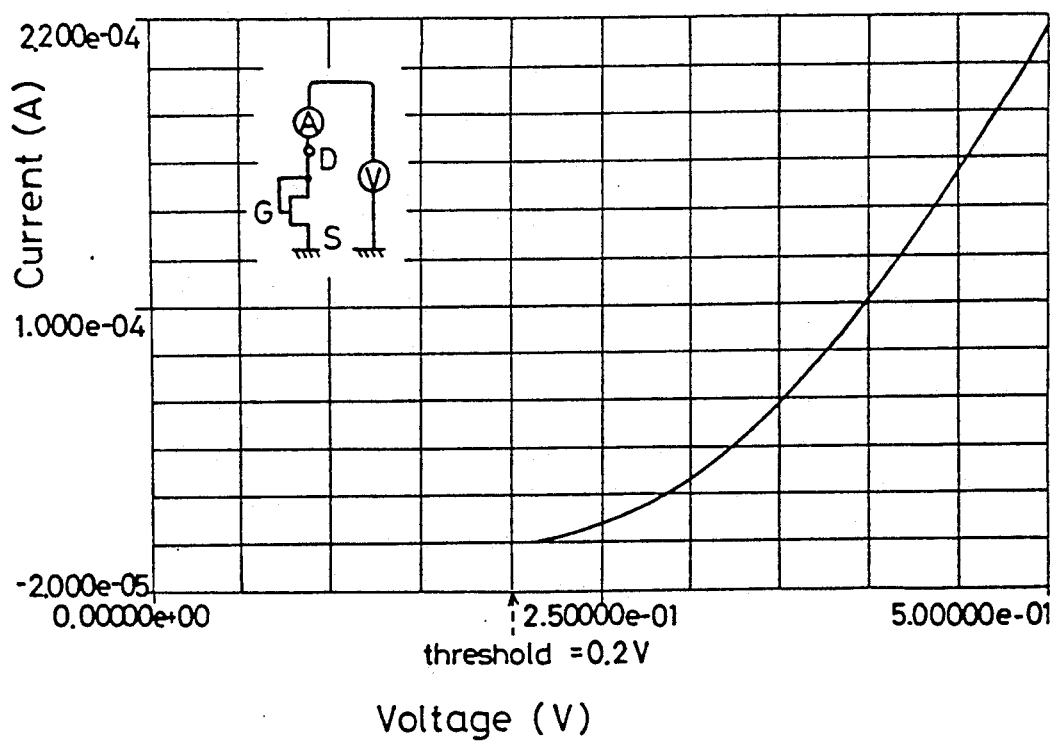
FIG. 9 is a diagram showing a voltage and a current characteristic of an enhancement type FET of FIG. 8.

As shown in FIG. 9 showing a voltage and a current characteristic of the enhancement type FET 8, the EFET 8 is an n-channel enhancement type FET which is designed so that a current starts to flow when a voltage applied to the EFET exceeds a threshold voltage Vth (0.2V).

A description is given of operations.

The fundamental operations are the same as those of the prior art optical receiver 20 shown in FIG. 17.

Figure 10:
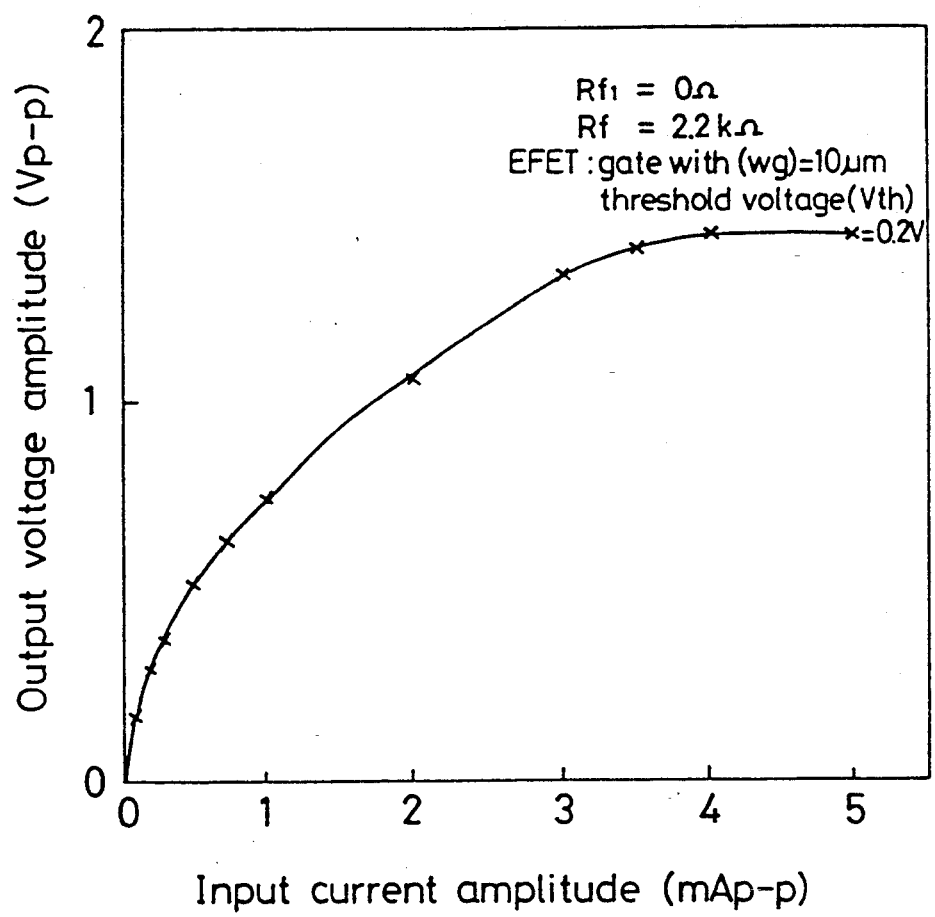
FIG. 10 is a diagram showing an input and an output characteristic of the preamplifier of FIG. 8.

When an input signal which is input from the photodiode 5 into the preamplifier 1c increases and the voltage drop in the feedback resistor 3b becomes larger than the threshold voltage (0.2V) of the enhancement type FET 8 in accordance with an increase in the input signal, a current starts to flow through the enhancement type FET 8 and the substantive feedback resistance value Rfs begins to vary. FIG. 10 is a diagram showing a characteristic of the output voltage amplitude versus the input current amplitude of the preamplifier 1c. Here, feedback resistance value Rf1 of the feedback resistor 3a is 0Ω, the feedback resistance value Rf2 of the feedback resistor 3b is 2.2kΩ, the drain resistance of the EFET 8 is 122⅔ and a source resistance thereof is 122⅔.

As shown in the figure, in this preamplifier 1c, when the input current is 0.1 mAp-p and the voltage drop in the feedback resistor 3b is above 0.2V, current gradually begins to flow through the EFET 8 connected in parallel with the feedback resistor 3b and the substantive feedback resistance value starts to vary from this point. Thereafter, as the input current increases and the voltage drop in the feedback resistor 3b increases further, the current flowing through the EFET 8 increases and the result is that the substantive feedback resistance value Rfs is gradually reduced. Here, the EFET 8 is designed to have a threshold voltage Vth of 0.2V, but this threshold voltage Vth can be changed at the production step.

In the preamplifier of this embodiment, at a point when the voltage drop in the feedback resistor 3b becomes larger than the threshold voltage of the enhancement type FET 8, the current gradually begins to flow through the enhancement type FET 8 (in other words, the substantive feedback resistance value Rfs is switched) and with an increase in the input signal, the substantive feedback resistance value Rfs is gradually reduced. As a result, before and after the substantive feedback resistance value is switched the amplification factor of the amplifier is gradually reduced and the input dynamic range is enlarged keeping the amplification characteristic close to a linear characteristic.

In all of the above-described embodiments, since not all the feedback resistors connected in parallel with the voltage amplifier 2 but a part of the resistors, namely the feedback resistor 3b, of the two feedback resistors 3a and 3b which are connected in series to each other, by adjusting the resistance values of the feedback resistors 3a and 3b in the production process, the input dynamic range can be enlarged while considering the amplification factors before and after the substantive feedback resistance value Rfs is switched.

As described above, in accordance with the present invention, since a plurality of diodes connected in series to each other are connected in parallel with a feedback resistor arranged in parallel with a voltage amplifier such that an anode side of the diodes is connected to an input side of a voltage amplifier and a cathode thereof is connected to an output side of the voltage amplifier, the input signal level at which a substantive feedback resistance value is switched, can be changed in accordance with the number of diodes, thereby enlarging the input dynamic range while considering the sensitivity of the amplifier (the output voltage amplitude) or the amplification factor.

Further, in accordance with the present invention, since a fuse is connected in parallel with each of the diodes which are connected in series to each other, by carrying out laser trimming of the desired fuse in operating the amplifier, the input signal level at which the substantive feedback resistance value is switched can be changed, thereby resulting in a more practical preamplifier which can enlarge the input dynamic range while considering the sensitivity of the amplifier (the output voltage amplitude) or the amplification factor.

Still, in accordance with the present invention, since bonding pads are connected respectively to an input and an output side of each of the diodes which are connected in series to each other, by a wire bonding between the desired bonding pads in operating the amplifier, the input signal level a which the substantive feedback resistance value is switched, can be changed, to result in a more practical preamplifier which can enlarge the input dynamic range considering the sensitivity of the amplifier (the output voltage amplitude) or the amplification factor.

Yet, in accordance with the present invention, since an FET is connected in parallel with each of the diodes, by controlling the "on" or "off" state of the FET with an external signal applied to a gate of the FET in operating the amplifier, the input signal level at which the substantive feedback resistance value is switched can be changed, to result in a more practical preamplifier which can enlarge the input dynamic range considering the sensitivity of the amplifier (the output voltage amplitude) or the amplification factor.

Still further, in accordance with the present invention, since an enhancement type FET is connected in parallel with a feedback resistor connected in parallel with a voltage amplifier such that the drain and the gate of the FET are connected to an input side of the voltage amplifier and the source is connected to an output side of the voltage amplifier, the substantive feedback resistance value does not rapidly change and an enlarged input dynamic range is obtained maintaining a nearly linear amplification characteristic.

What is claimed is:

1. A preamplifier for converting an input current signal into a voltage signal and outputting the voltage signal comprising:
    a voltage amplifier having an input terminal and an output terminal;
    a feedback resistor comprising first and second resistors connected in series to each other, said feedback resistor being connected in parallel with said voltage amplifier between said input terminal and said output terminal; and
    a plurality of diodes, each diode having an anode and a cathode and connected in series in common polarity to each other and in parallel with said first resistor so that the anode of a first of the diodes is connected to a first terminal of said first resistor and the cathode of a last of the diodes is connected to a second terminal of said first resistor.

2. The preamplifier of claim 1 including a respective fuse connected in parallel with each of said diodes.

3. The preamplifier of claim 2 including a respective fuse connected in parallel with each of said diodes.

4. The preamplifier of claim 1 including a respective bonding pad connected to each of the cathodes and the anodes of said diodes.

5. The preamplifier of claim 2 including a respective bonding pad connected to each of the cathodes and the anodes of said diodes.

6. The preamplifier of claim 1 including a respective field effect transistor connected in parallel with each of the didoes.

7. The preamplifier of claim 2 including a respective field effect transistor connected in parallel with each of the diodes.

8. The preamplifier of claim 1 including an optical receiver generating a signal connected to said input terminal of said voltage amplifier.

9. A preamplifier for converting an input current signal into an output voltage signal comprising:
    a voltage amplifier having an input terminal and an output terminal;
    a feedback resistor comprising a first and a second resistor connected in series, said feedback resistor being connected in parallel with said voltage amplifier between said input terminal and said output terminal; and
    an enhancement-type field effect transistor having a source, a gate, and a drain and connected in parallel with said first resistor and in series with said second resistor, with said drain and said gate connected together and to a first terminal of said first resistor and said source connected to a second terminal of said first resistor.

10. The preamplifier of claim 9 including an optical receiver generating a current signal connected to said input terminal of said voltage amplifier.

* * * * *